United States Patent [19]

Albert

[11] Patent Number: 4,980,598
[45] Date of Patent: Dec. 25, 1990

[54] MONOLITHIC RESONATOR FOR A VIBRATING BEAM ACCELEROMETER

[75] Inventor: William C. Albert, Boonton, N.J.

[73] Assignee: Lucas Schaevitz Inc., Pennsauken, N.J.

[21] Appl. No.: 454,402

[22] Filed: Dec. 21, 1989

[51] Int. Cl.$^5$ .................... H01L 41/04; G01P 15/09
[52] U.S. Cl. ..................... 310/321; 73/517 AV; 73/DIG. 1; 310/25; 310/323; 310/324; 310/338
[58] Field of Search ............ 310/321, 323, 324, 338, 310/25, 329, 330; 73/774, 778, 517 AV, DIG. 1, DIG. 4

[56] References Cited

U.S. PATENT DOCUMENTS

| | | | |
|---|---|---|---|
| 3,141,100 | 7/1964 | Hart | 310/8.6 |
| 3,238,789 | 7/1966 | Erdley | 73/517 |
| 3,470,400 | 12/1967 | Weisbord | 310/25 |
| 3,479,536 | 11/1969 | Norris | 310/330 |
| 3,596,212 | 7/1971 | Warner | 333/72 |
| 3,599,124 | 8/1971 | Smith | 333/72 |
| 4,104,920 | 8/1978 | Albert | 73/DIG. 1 |
| 4,321,500 | 3/1982 | Paros | 310/321 |
| 4,445,065 | 4/1984 | Albert | 310/321 |
| 4,446,394 | 5/1984 | Albert | 310/323 |
| 4,467,651 | 8/1984 | Peters et al. | 73/497 |
| 4,479,388 | 10/1984 | Matzuk | 73/634 |
| 4,538,461 | 9/1985 | Juptner et al. | 73/505 |
| 4,628,735 | 12/1986 | Kirkpatrick | 73/517 AV |
| 4,637,255 | 1/1987 | Martin | 73/517 R |
| 4,653,326 | 3/1987 | Danel et al. | 73/517 R |
| 4,656,383 | 4/1987 | Albert | 310/321 |
| 4,658,174 | 4/1987 | Albert | 310/323 |
| 4,658,175 | 4/1987 | Albert | 310/323 |
| 4,667,127 | 5/1987 | Krempl et al. | 310/338 |
| 4,710,668 | 12/1987 | Firma et al. | 310/321 |
| 4,724,351 | 2/1988 | EerNisse et al. | 310/329 |
| 4,739,211 | 4/1988 | Strachan | 310/321 |
| 4,743,790 | 5/1988 | Albert | 310/321 |
| 4,785,215 | 11/1988 | Blech | 310/329 |
| 4,804,875 | 2/1989 | Albert | 310/323 |

FOREIGN PATENT DOCUMENTS 2239997 3/1972 Fed. Rep. of Germany ... 73/DIG. 1

Primary Examiner—Steven L. Stephan
Assistant Examiner—Thomas M. Dougherty
Attorney, Agent, or Firm—Nixon & Vanderhye

[57] ABSTRACT

A monolithic resonator for a vibrating beam accelerometer is provided which comprises an outer structure including a mounting structure, a proof mass structure, a plurality of flexure beams extending between the mounting and proof mass structures; and an inner structure including first and second isolator masses, first and second isolator beams connected to one portion of the isolator masses, respectively, and a vibrating beam extending between other portions of the isolator masses. The monolithic resonator is non-planar in that the outer structure has a thickness greater than said inner structure.

23 Claims, 3 Drawing Sheets

1

MONOLITHIC RESONATOR FOR A VIBRATING BEAM ACCELEROMETER

BACKGROUND AND SUMMARY OF THE INVENTION

The present invention relates to a monolithic resonator for use in a vibrating beam accelerometer (VBA) in which the proof mass, the proof mass suspension system and the resonator are made from a single piece of quartz crystal. The sensing element or resonator is a force-sensitive, vibrating beam. The vibrations of the vibrating beam are sustained by the combined interaction of the electrode pattern plated on the beam, the piezoelectric properties of the quartz crystal material and the electrical energy supplied by the electronic oscillator circuit. When the vibrating beam experiences axial tension, its vibration frequency increases and inversely, when the beam experiences compression, its vibration frequency decreases. The advantages of such a sensing element in an accelerometer application include a direct digital output as well as good stability and low temperature sensitivity due to the properties of quartz crystal. The advantages to be gained by fabricating the structure from a single piece of quartz crystal include low cost, elimination of many assembly operations, elimination of joints, and compact size.

Single piece VBA's, per se, are known in the art, for example, see U.S. Pat. No. 4,804,875 which discloses a monolithic piezoelectric structure in both single and dual vibrating beam configurations. See also, as representative examples, U.S. Pat. Nos. 4,658,174; 4,658,175; 4,656,383; 4,446,394; 4,445,065, 3,479,536 and 3,470,400.

In one exemplary embodiment in accordance with this invention, the sensing element comprises a vibrating beam, isolator masses and isolator beams generally of the type shown in U.S. Pat. No. 4,743,790, owned by the assignee of this invention. In accordance with this invention, however, one end of the resonator or sensing element is attached to the mount structure, while the other end is attached to the proof mass structure, and these two structures are joined together by means of a series of flexure beams. Absent the vibrating beam sensing element, the flexure beams would otherwise permit the mount structure and the proof mass structure to move relative to each other in a parallel like motion along a given axis.

The mount structure and proof mass structure each include appendages, for mounting the sensing element to an external surface such as an accelerometer housing, and for mounting an additional proof mass to increase the total mass of the device, respectively.

As will be explained in greater detail below, the present invention also incorporates a non-planar design which has many advantages over prior art constructions. For example, typical prior art designs utilize planar construction whereby the thickness of all parts of the structure are equal. The accelerometer design of this invention utilizes a non-planar approach whereby the outer structure, consisting of the flexure beams and mount structures, may be from three to ten times thicker than the inner structure vibrating beam portion. This arrangement achieves a structure which can withstand Z axis acceleration and vibration, while being sufficiently sensitive to X input axis acceleration. In addition, structure stiffness along the Z axis is achieved by making the outer structure thickness as great as necessary. If the thickness of the inner structure is increased correspondingly with the thickness of the outer structure, the force sensitivity of the vibrating beam would decrease since the sensitivity of the vibrating beam sensing element is inversely proportional to the Z axis thickness. Low vibrating beam sensitivity would mean that a heavier proof mass would be needed which in turn, would place the outer structure under a greater load to Z axis acceleration. Thus, it has been determined that a single thickness structure is not practical because the outer structure Z axis stiffness requirements cannot be conveniently made compatible with the vibrating beam inner structure sensitivity requirements. By adopting a non-planar approach, the outer and inner structure stiffness requirements are no longer related, so that the Z axis stiffness requirements and vibrating beam sensitivity requirements can be conveniently met.

Another advantage of the present invention is the utilization of multiple flexure beams. This arrangement results in an outer structure which is very stiff to Z axis loads but very compliant to X axis loads, as will be explained in greater detail below.

feature of the present invention is the placement of all flexure beams at the bottom end of the structure. This keeps the center of gravity of the proof mass low on the structure.

Another feature of the present invention relates to the addition of the above described mount appendages which enables the structure to be attached to an external case or housing, and also enables attachment of an additional proof mass. In this regard, if the mount structure portion were used to mount the sensing element directly to an external case housing, the mount structure would experience strains due to clamping forces, differential thermal expansion effects, etc. These strains would distort the structure and the vibrating beam would experience erroneous axial forces. Locating the clamping or other mounting means on the mount structure appendage does not cause such errors because the appendage is not located in a region where such strains would cause vibrating beam error forces. The same is true with respect to the attachment of an additional proof mass to the proof mass appendage.

It will be appreciated that various alternatives to the above described configuration are within the scope of the invention. For example, while in one presently preferred embodiment three flexure beams are utilized, it will be understood that any number of flexure beams greater than two may be utilized. Specifically, the number and geometry of the flexure beams depends on the ratio of X axis compliance to Z axis stiffness required, and also on anticipated stress levels.

It will also be understood that the use of the above described appendages may be reversed, i.e., the external mount appendage can be used for mounting the proof mass and the proof mass appendage can be used for the external mounting.

In the above described embodiment, the proof mass structure extends only to the lower end of the inner structure, whereas the mounting structure extends the full height of the device. In another exemplary embodiment of the invention, however, the proof mass structure may be extended to the full height of the device, and one or more flexure beams added to the top part of the structure. As a result of this configuration, the rather fragile inner structure is further protected during handling by being more fully surrounded by the relatively thick and rugged outer structure. In addition, the added flexure beam or beams at the top of the structure may provide more overall stiffness for the entire structure.

In another exemplary embodiment, only one mounting structure appendage is required since sufficient proof mass is provided by the resonator structure per se. In this embodiment, a pair of vertically spaced flexure beams are provided in the lower portion of the structure.

In its broader aspects, the present invention provides a monolithic resonator for a vibrating beam accelerometer which comprises an outer structure including a mounting structure, a proof mass structure, a plurality of flexure beams extending between the mounting and proof mass structures; and an inner structure including first and second isolator masses, first and second isolator beams connected to one portion of the isolator masses, respectively, and a vibrating beam extending between other portions of the isolator masses; wherein the outer structure has a thickness greater than said inner structure.

Objects and advantages of this invention in addition to those noted above will become apparent from the detailed description which follows.

DETAILED DESCRIPTION OF THE INVENTION

Figure 2:
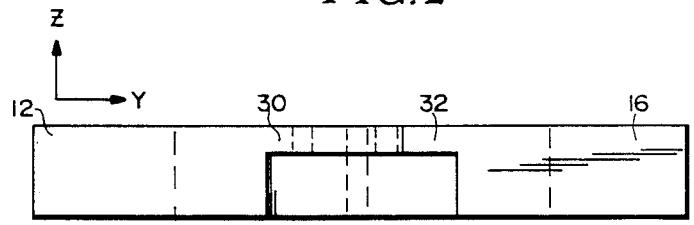
FIG. 2 is a top view of the resonator illustrated in FIG. 1.

A monolithic sensory element 10 of piezoelectric material includes a mounting structure 12, a mounting structure appendage 14, a proof mass structure 16 and a proof mass mounting appendage 18. A vibrating beam 20 extends between a pair of isolator masses 22, 24 which, in turn, are connected via isolator beams 26, 28 respectively, to surfaces 30, 32. A plurality of flexure beams 34 extend horizontally between the mounting structure 12 and proof mass structure 16, relative to the vertical orientation of the vibrating beam 20.

A conventional electrode termination shown partially at 36 is provided from which leads 38, 40 extend to a conventional oscillator circuit (not shown). The beam plated electrode pattern and plated conductive paths from the vibrating beam 20 to the electrode termination 36 are also not shown since they can be any one of several piezoelectric drive patterns well known in the crystal oscillator art.

The mounting structure 12, as noted above, includes a mounting appendage 14 for mounting the unit to an accelerometer housing (not shown in FIG. 1), for example, while the proof mass mounting appendage 18 may be employed to mount additional proof mass elements (not shown in FIG. 1) in order to increase the total mass and acceleration sensitivity of the structure.

With reference particularly to FIG. 2, it may be seen that the inner structure of element 10, including the vibrating beam 20, isolator masses 22, 24, isolator beams 26, 28 and surfaces 30, 32 are significantly thinner, e.g., about 3 to 10 times thinner, in the Z-axis direction than the outer structure.

Figure 3:
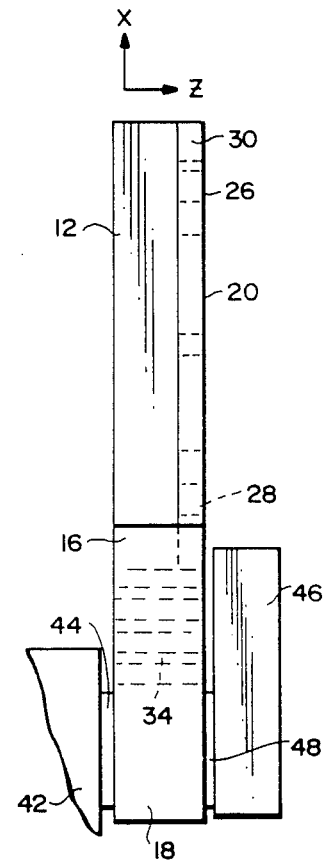
FIG. 3 is a side view of the resonator illustrated in FIG. 1.

FIG. 3 illustrates an external mount 42, such as an accelerometer housing, connected at 44 to the external mount appendage 14, and a second proof mass 46 connected at 48 to the proof mass mount appendage 18.

Figure 1:
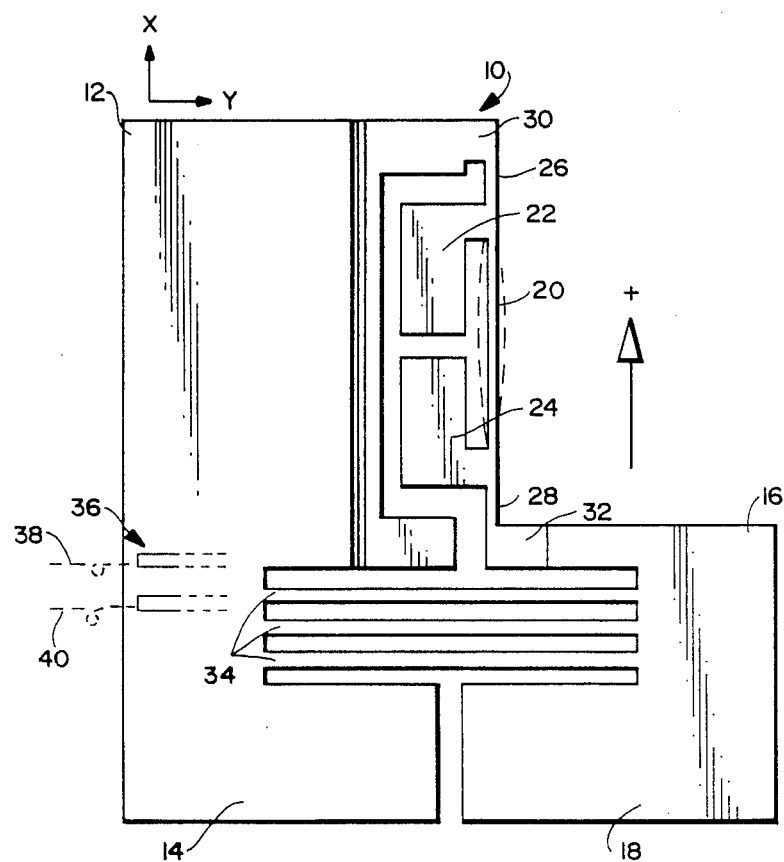
FIG. 1 is a front elevational view of one exemplary embodiment of a monolithic resonator in accordance with the invention.

In use, the structure of FIG. 1 is mounted within an accelerometer housing by means of the external mounting appendage 14. Also, as already noted, an additional mass 46 may be added to the structure at the proof mass mounting appendage 18 to increase acceleration sensitivity. It has been discovered, however, that the vibrating beam 20 may be made sufficiently thin, i.e., sufficiently sensitive to acceleration, relative to the thicker outer structure, that additional external proof masses are not necessary. Upon sensing acceleration along the sensing axis X, the proof mass structure 16 tries to deflect relative to the mount structure 12 in the X direction as would be permitted by the compliant flexure beams 34. However, this relative deflection is restrained by the axially stiff vibrating beam 20 so that the vibrating beam will experience either tension or compression depending on the sense of the input acceleration. Since the vibration frequency of the vibrating beam 20 is sensitive to axial force, this frequency will change in proportion to the magnitude and direction of the input acceleration. The frequency change from a known zero load bias frequency is therefore a measure of input acceleration.

It will be appreciated that variations from the device illustrated in FIG. 1 are possible which nevertheless remain within the scope of the invention. For example, while FIG. 1 shows three flexure beams 34, it is understood that any number above two (the minimum number required to achieve parallel action) or more can be used. The number and geometry of the flexure beams depends on the ratio of X axis compliance to Z axis stiffness required, and also on anticipated stress levels.

It is also contemplated that the uses of the appendages may be reversed. That is, the external mounting appendage 14 can be used for mounting the proof mass 46 and the proof mass mounting appendage 18 can be used for the external mounting 42. In this arrangement, a positive input acceleration (as indicated in FIG. 1) will cause the vibrating beam to experience compression rather than tension. Moreover, the plated conductive paths which connect the vibrating beam electrodes to the lead termination area 36 will be rearranged so that the lead termination area appears on the "proof mass" structure 16 of FIG. 1. Having the same physical structure plated and mounted each way allows the resonators to be used in pairs so that an input acceleration will cause one vibrating beam to experience tension while the other is experiencing compression. The instrument output is then taken as the difference frequency. Frequency differencing has many performance advantages which include common mode rejection of nonlinearity and thermal errors. The performance advantages of this "dual beam," arrangement are fully explained in U.S. Pat. No. 4,804,875.

Figure 4:
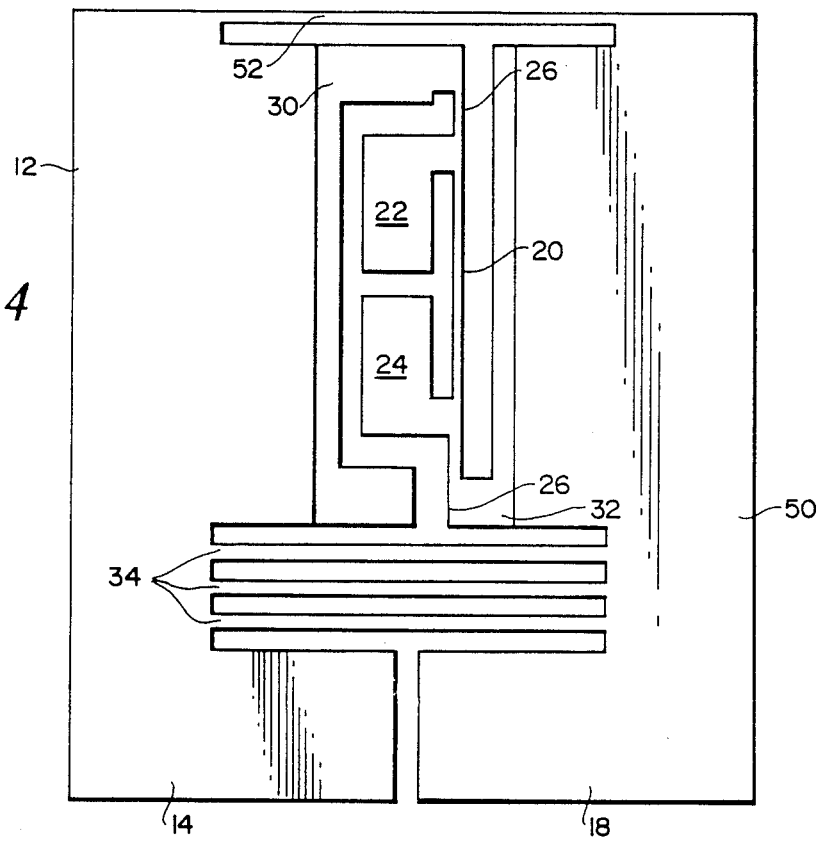
FIG. 4 is a front elevational view of a second exemplary embodiment of the invention.

Another alternative method of construction is illustrated in FIG. 4 in which like reference numerals are used to designate like elements. In this alternative embodiment, a proof mass structure 50 is extended upwardly to a point level with the mount structure 12, and another flexure beam 52 is added to the top part of the structure between the proof mass 50 and mount structure 12. It will be appreciated that more than one additional flexure beam 52 may be employed. Advantages gained by this alternative design include additional protection of the rather fragile inner structure during handling, as a result of being more fully surrounded by the relatively thick and rugged outer structure, and increased overall stiffness.

Figure 5:
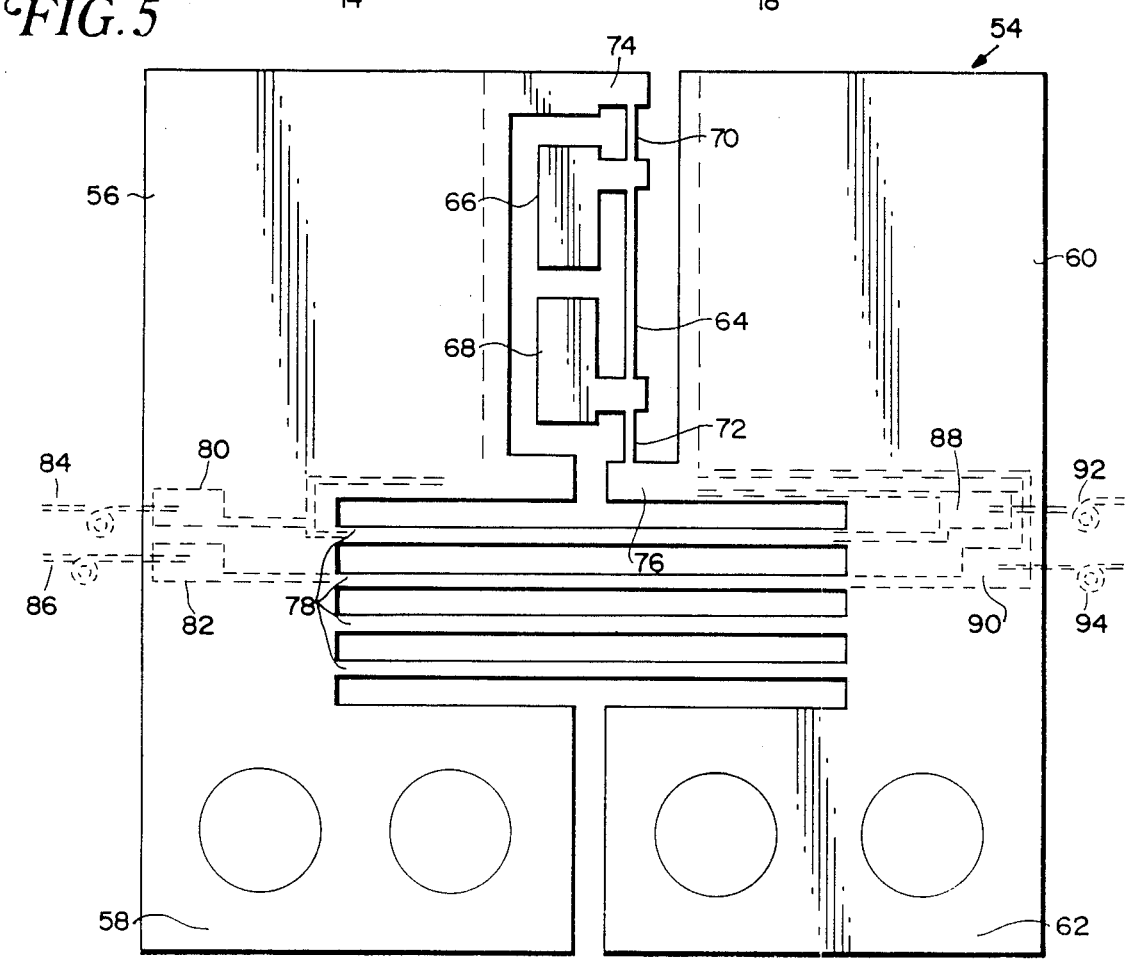
FIG. 5 is a front elevational view of a third exemplary embodiment of the invention.

Turning to FIG. 5, another embodiment of the invention is illustrated. The accelerometer 54 is provided with a mount structure 56 including an external mounting appendage 58, and a proof mass structure 60 including an external mounting appendage 62. A vibrating beam 64 extends between a pair of isolator beams 70, 72, respectively, to surfaces 74, 76. A plurality of flexure beams 78 extend between the mounting structure 56 and proof mass structure 60, respectively, in a direction substantially perpendicular to the orientation of the vibrating beam 64.

In this embodiment, the accelerometer element may be mounted in either of two configurations. In order to accommodate this alternative mounting, optional electrode termination areas (shown in phantom) are also provided in the electrode plating pattern.

In one mounting, electrode terminations 80, 82 are provided, with associated leads 84, 86 extending to the oscillator circuit (not shown). In the other, electrode terminations 88, 90 are provided with associated leads 92, 94. This arrangement permits a single resonator structure and single plating pattern to be used as either a tension or compression resonator, depending on how the element is mounted.

Figure 7:
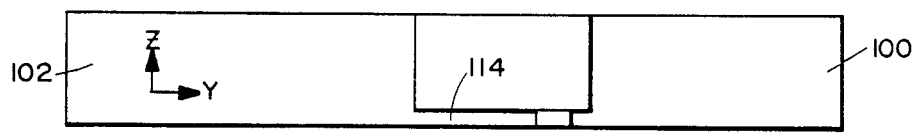
FIG. 7 is a top view of the resonator illustrated in FIG. 6.
Figure 6:
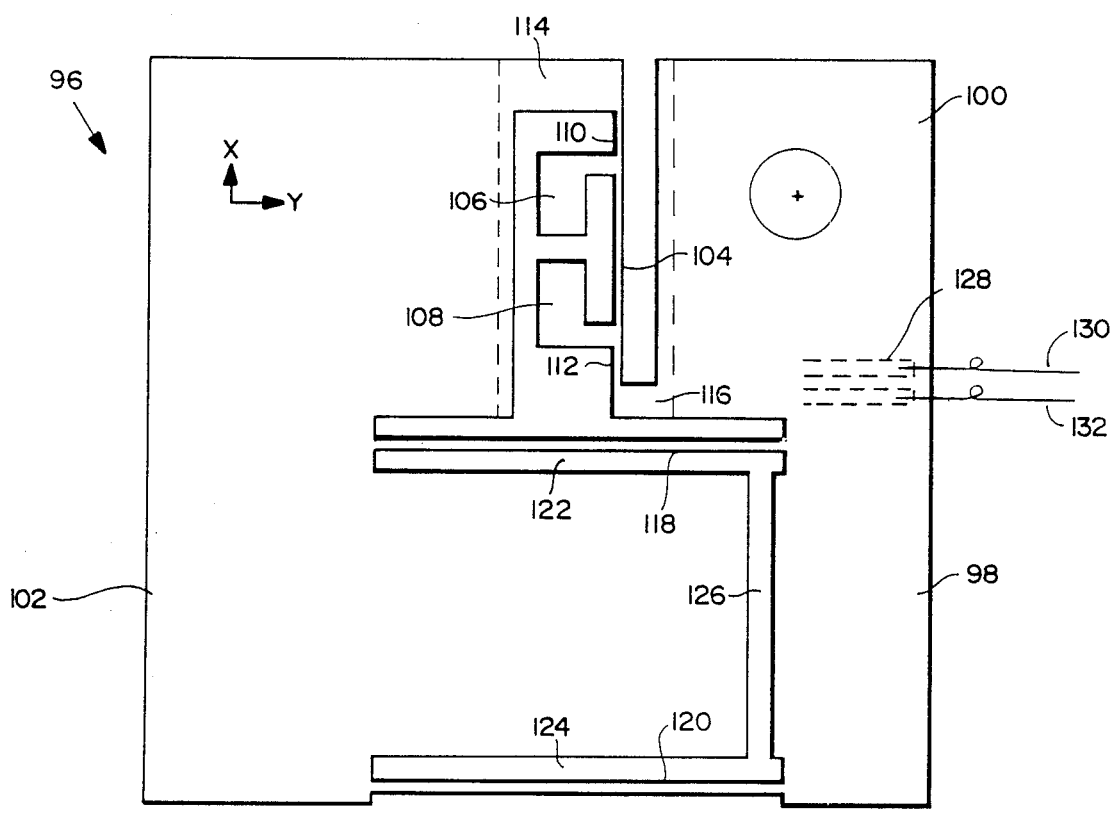
FIG. 6 is a front elevational view of a fourth exemplary embodiment of the invention.

Still another exemplary embodiment of the invention is illustrated in FIGS. 6 and 7. The resonator 96 includes a mounting structure 98, a mounting structure appendage 100, and a proof mass structure 102. A vibrating beam 104 extends between a pair of isolator masses 106, 108 which, in turn, are connected via isolator beams 110, 112, respectively, to surfaces 114, 116. Flexure beams 118, 120 extend horizontally between the mounting structure 98 and the proof mass structure 102. Space 122 below the upper beam 118 is connected to space 124 above the lower beam 120 by a vertically extending slot or space 126.

A conventional electrode termination shown in phantom at 128 is provided from which leads 130, 132 extend to a conventional oscillator circuit (not shown).

As in the previously described embodiments, the inner structure including beam 104, isolator masses 106, 108, isolator beams 110, 112 and surfaces 114, 116 are significantly thinner in the Z-axis direction than the outer structure including the mounting structure 98, mounting structure appendage 100, proof mass structure 102 and flexure beams 118, 120.

This exemplary embodiment of the invention is of simpler design than the previously described embodiments in that only a single mounting appendage 100 is required. This is because the thinness and sensitivity of the inner structure results in the proof mass 102 being sufficient, i.e., there is no need for a second mounting appendage for attaching a supplemental proof mass. This is particularly true for dual-beam, push/pull applications, where one resonator 96 will be mounted upside down relative to another identical resonator.

In addition, the resonator 96 illustrated in FIGS. 6 and 7 requires only a single flexure beam 118, 120 at each of two, vertically spaced locations. By thus separating the flexure beams, the angular stiffness of the proof mass is increased relative to moments about the Y-axis. In the event an even stiffer resonator structure is required, multiple flexure beams can be located at one or both of the upper and lower, vertically separated locations.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A monolithic resonator for a vibrating beam accelerometer comprising:
   an outer structure including a mounting structure, a proof mass structure, a plurality of flexure beams extending between said mounting and proof mass structures; and
   an inner structure including first and second isolator masses, first and second isolator beams each connected at one end to a respective portion of said first and second isolator masses, and at the other end to the mounting structure and proof mass structure, respectively, and a vibrating beam extending between other portions of said isolator masses;
   wherein said outer structure has a thickness greater than said inner structure.

2. A monolithic resonator according to claim 1 wherein said outer structure thickness is about three to about ten times the thickness of said inner structure.

3. A monolithic resonator according to claim 1, wherein said inner and outer structures lie within a common plane along one face of the resonator, and said inner and outer structure lie, respectively, within a pair of parallel planes along another face.

4. A monolithic resonator according to claim 3, wherein the resonator has a height extending in an X direction, a length extending in a Y direction, and a thickness extending in a Z direction, said X, Y, and Z directions being substantially mutually perpendicular.

5. A monolithic resonator according to claim 4, wherein said parallel planes extend in the X-Y directions.

6. A monolithic resonator according to claim 1 and further including a mounting structure appendage for attaching said resonator to an accelerometer housing.

7. A monolithic resonator according to claim 1 and further including a proof mass structure appendage for attaching an additional proof mass.

8. A monolithic resonator according to claim 1, wherein all of said plurality of flexure beams are located in proximity to one end of said vibrating beam and extend substantially perpendicular thereto.

9. A monolithic resonator according to claim 1, wherein said vibrating beam extends longitudinally in the X-direction.

10. A monolithic resonator according to claim 4 wherein said proof mass structure extends in the X-direction less than about one half an extent in the X-direction of said mounting mass structure.

11. A monolithic resonator according to claim 8, wherein said plurality of flexure beams comprises three flexure beams for load stiffness in the Z-direction and load sensitivity in the X-direction.

12. A monolithic resonator according to claim 4, wherein said mounting structure and said proof mass structure extend substantially equally in the X-direction, and wherein said plurality of flexure beams are located in proximity to one end of said vibrating beam.

13. A monolithic resonator according to claim 12, wherein one or more additional flexure beams are provided between said mounting and proof mass structure in proximity to the other end of said beam.

14. A monolithic resonator as defined in claim 12 wherein alternative electrode terminations are provided on both said mounting structure and said proof mass structure.

15. A monolithic resonator as defined in claim 1 wherein alternative electrode terminations are provided on both said mounting structure and said proof mass structure.

16. A monolithic resonator as defined in claim 8 wherein said plurality of flexure beams comprises a pair of vertically spaced beams.

17. A monolithic resonator comprising:
a vibrating beam;
unitary isolator mass means at either end of said beam;
isolator beams extending from each of said isolator mass means;
a mounting structure to one side of said beam, and a proof mass structure to the other side of said beam; and
a plurality of flexure beams extending between said mounting structure and said proof mass structure, below said vibrating beam and substantially perpendicular thereto.

18. A monolithic resonator as defined in claim 17 and further comprising at least one additional flexure beam extending between said mounting structure and said proof mass structure above said vibrating beam and substantially parallel to said plurality of flexure beams.

19. A monolithic resonator according to claim 17 and further including alternative external mount appendages and alternative electrode terminations for selective attachment of leads, the choice of termination determined by the use of the resonator as a tension or compression resonator.

20. The monolithic resonator as defined in claim 17 wherein the beam, isolator mass means and isolator beams have a first thickness, and the mounting and proof mass structures have a second thickness.

21. A monolithic resonator as defined in claim 20 wherein the first thickness is about 0.015" and the second thickness is about 0.06 to 0.15 inch.

22. A monolithic resonator as defined in claim 17 wherein said proof mass and mounting structures have substantially identical height dimensions.

23. A monolithic resonator comprising:
a vibrating beam;
unitary isolator mass means at either end of said beam;
isolator beams extending from each of said isolator mass means;
a mounting structure to one side of said beam, and a proof mass structure to the other side of said beam; and
a plurality of flexure beams extending between said mounting structure and said proof mass structure, below said vibrating beam and substantially perpendicular thereto;
wherein said vibrating beam, said isolator mass means and said isolator beams have thicknesses about three to ten times less than thicknesses of at least said mounting structure and said proof mass structure.

* * * * *